United States Patent [19]

Freeborn

[11] 3,745,477

[45] July 10, 1973

[54] AMPLIFIER APPARATUS FOR USE WITH AN INDUCTIVE LOAD

[75] Inventor: John C. Freeborn, West Covina, Calif.

[73] Assignee: Honeywell Inc., Minneapolis, Minn.

[22] Filed: Jan. 26, 1972

[21] Appl. No.: 221,009

[52] U.S. Cl. .................... 330/13, 330/28, 330/30 D, 330/110

[51] Int. Cl. .................... H03f 3/18, H03f 1/34

[58] Field of Search .................... 330/13, 28, 30 D, 330/69, 110

[56] References Cited

UNITED STATES PATENTS

| | | | |
|---|---|---|---|
| 3,195,064 | 7/1965 | Offner | 330/13 |
| 3,376,388 | 4/1968 | Reiffin | 330/13 X |
| 3,419,809 | 12/1968 | Lach et al. | 330/69 X |
| 3,542,952 | 11/1970 | Wang | 330/28 X |
| 3,543,173 | 11/1970 | Egerton | 330/28 X |

*Primary Examiner*—Roy Lake
*Assistant Examiner*—James B. Mullins
*Attorney*—Charles J. Ungemach, Albin Medved and Charles L. Rubou

[57] ABSTRACT

Amplifier apparatus for precisely controlling current through an inductive load by means of an RC network which produces a feedback signal accurately simulating the load current. The RC network includes a resistor and a capacitor connected in series across the load and having values related to the parameters of the load such that a signal representative of the instantaneous load current is produced between the resistor and capacitor. The RC network may also include a T resistor arrangement to compensate for any lag occurring between the input and output signals of the amplifier.

10 Claims, 3 Drawing Figures

AMPLIFIER APPARATUS FOR USE WITH AN INDUCTIVE LOAD

BACKGROUND OF THE INVENTION

The present invention is related generally to electronic circuits, and more specifically to electronic amplifier apparatus for use with an inductive load. The invention is particularly applicable to magnetic cathode ray tube (CRT) beam deflection amplifier circuits.

Generally stated, the problem encountered in precisely energizing an inductive load, and particularly in driving the deflection coils of a CRT display, is to bring the load current to the desired magnitude as rapidly as possible while avoiding overshoot or oscillation about this value. An amplifier for performing such a function must also be capable of producing stable steady state current free from high frequency transients. Some form of feedback representative of the load current is required to achieve these objectives. One common prior art technique is to employ a current sensing resistor in series with the load. Since the same current flows through both the load and the sensing resistor, a voltage indicative of the load current is produced across the resistor. This voltage is used as the feedback signal.

It has been discovered that a problem frequently encountered with such an arrangement is the generation of high frequency transient pulses apparently resulting from distributed capacitance in the inductive load. These transient pulses are reflected in the feedback voltage which is transmitted back to the input of the amplifier. As a result, stability of amplifier operation is impaired. Another effect is that the acceptable ratio of open loop to closed loop gain is limited because oscillation occurs when the ratio is increased beyond some nominal value. Deflection amplifiers of prior art design are, thus, often limited to gains which are insufficient for certain applications.

SUMMARY OF THE INVENTION

The present invention overcomes the foregoing problems by employing an RC feedback network in parallel with the load to simulate the response which is ideally produced across the feedback resistor in prior art amplifiers. Most simply, the feedback network comprises a resistor and a capacitor connected in series across the load. The voltage developed across the capacitor as a result of current supplied to the load is used to provide the feedback signal. The capacitor and resistor are chosen to have values related to parameters of the load such that the feedback signal accurately represents the load current. A resistive voltage divider may also be provided in parallel with the series connected resistor-capacitor to control any overshoot arising from lag introduced by the amplifier circuitry.

Current in either direction through the load may be effectively provided by means of a pair of floating power supplies each connected in series with a current regulating circuit. Each power supply-regulating circuit combination provides for current through the load in a different direction. The regulating circuits are differentially energized by means of a control circuit. The effects of ripple on the power supply outputs can be overcome by means of unidirectional voltage limiting circuits, thus permitting the use of inexpensive power supplies.

It is, therefore, an object of this invention to provide an improved amplifier for use with inductive loads.

It is a further object of the invention to provide an amplifier having a unique network for producing a feedback signal which accurately simulates the electrical response of an inductive load.

Additional objects and advantages of the present invention may be ascertained from a study of the specification and claims in conjunction with the associated drawings.

DESCRIPTION OF THE PREFERRED EMBODIMENT

Figures 1, 2, 3:
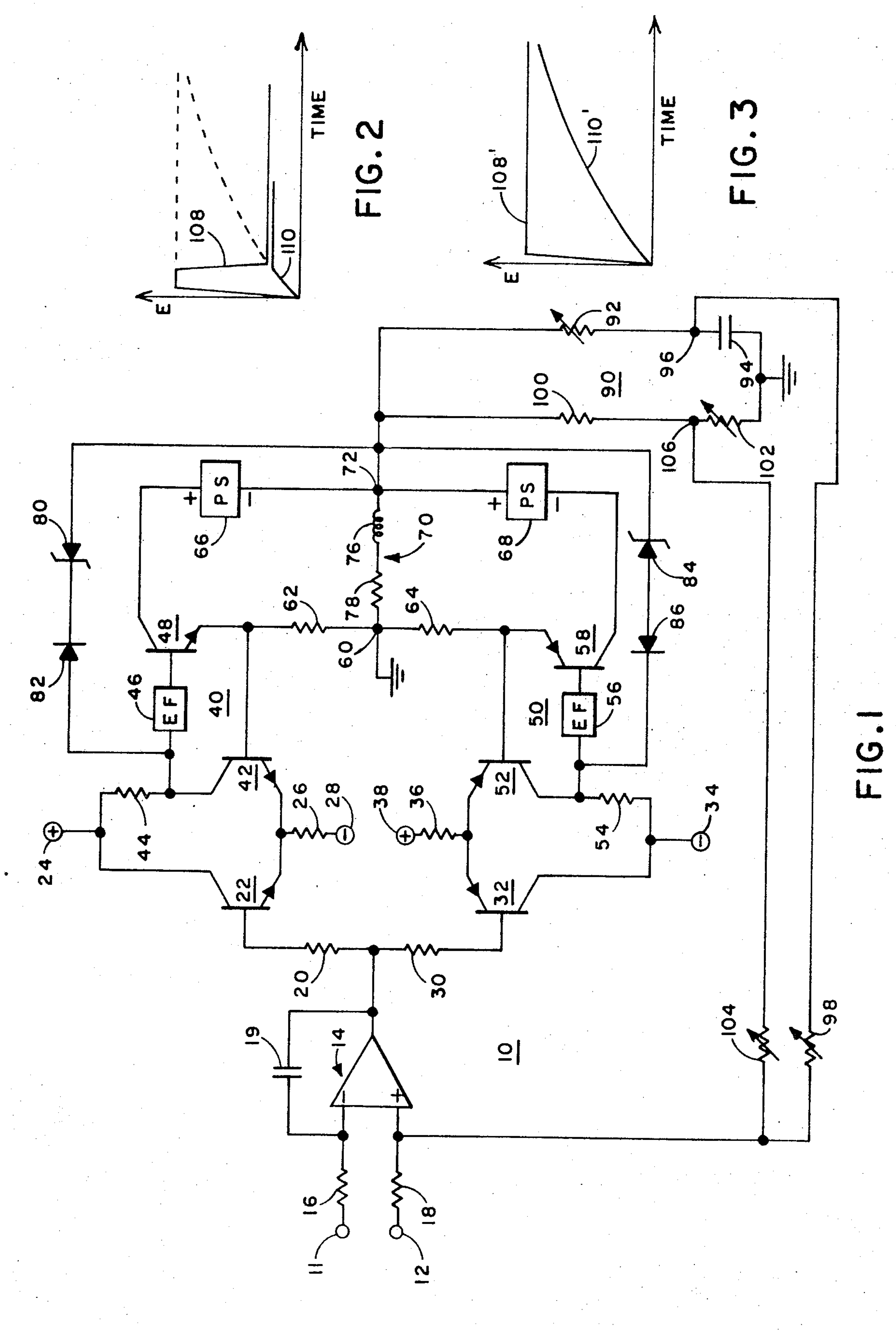
FIG. 1 is a circuit diagram of a preferred embodiment of the applicant's amplifier.
FIG. 2 is a graphic representation of a typical output voltage and feedback signal with the amplifier connected for closed loop operation.
FIG. 3 is a graphic representation of the feedback signal produced by the feedback network with the amplifier in open loop operation.

In FIG. 1 the applicant's amplifier for use with inductive loads is generally identified by reference numeral 10. Amplifier 10 includes a pair of input terminals 11 and 12 between which a control signal can be supplied. Terminal 11, which may be maintained at a reference potential, is shown connected to a negative or inverting input of a differential amplifier 14 through a resistor 16. Terminal 12 is connected to a positive or non-inverting input of amplifier 14 through a resistor 18. A capacitor 19 is connected between the output of the amplifier and its inverting input to provide local feedback.

The output of amplifier 14 is connected through a resistor 20 to the base of NPN transistor generally identified by reference numeral 22. The collector of transistor 22 is connected to a positive power supply terminal 24. The emitter of transistor 22 is connected through a resistor 26 to a negative power supply terminal 28.

The output of amplifier 14 is also connected through a resistor 30 to the base of PNP transistor generally identified by reference numeral 32. The collector of transistor 32 is connected to a negative power supply terminal 34. The emitter of transistor 32 is connected through a resistor 36 to a positive power supply terminal 38. In most cases the terminals identified by reference numerals 24, 38 and reference numerals 28, 34 respectively comprise positive and negative terminals of a single power supply.

Elements 11–38 comprise a differential control circuit which controls first and second current regulating circuits respectively identified by reference numerals 40 and 50. Current regulating circuit 40 includes an NPN transistor 42 having an emitter connected to the emitter of transistor 22 and a collector connected to power supply terminal 24 through a resistor 44. The collector of transistor 42 is also connected through an emitter follower stage 46 to the base of an NPN transistor 48. Emitter follower stage 46 may comprise one or more emitter follower connected transistors. In applications where minimum gain is required, the emitter follower stage may comprise a direct connection between the collector of transistor 42 and the base of transistor 48. The emitter of transistor 48 is connected back to the base of transistor 42, and to a junction point 60 through a resistor 62. Junction point 60 is maintained at the reference potential. Transistor 42 and the connections associated therewith form a feedback loop which aids in precisely regulating current through transistor 48 in accordance with the output signal from amplifier 14.

Current regulating circuit 50, which is similar to circuit 40, comprises a PNP transistor 52 whose emitter is connected to the emitter of transistor 32 and whose collector is connected to power supply terminal 34 through a resistor 54. The collector of transistor 52 is also connected through an emitter follower stage 56 to the base of a PNP transistor 58. The emitter of transistor 58 is connected back to the base of transistor 52, and to junction point 60 through a resistor 64. As in emitter follower stage 46, emitter follower stage 56 may comprise one or more emitter follower connected transistors, or a direct connection. Transistor 52 performs a feedback function similar to that performed by transistor 42. The differential control circuit comprising elements 11–38 and current regulating loops 40 and 50 make up current regulating means which is responsive to the summation of a control signal and a feedback signal as will hereinafter be described.

Although the feedback loops including transistors 42 and 52 aid in precisely regulating the currents through transistors 48 and 58, they are not essential to the applicant's invention. Good performance can be achieved by controlling transistors 48 and 58 directly with the signal from amplifier 14. In such an embodiment resistors 20 and 30 are respectively connected to emitter follower stages 46 and 56. The differential control circuit then includes only elements 11–20 and 30, and current regulating circuits 40 and 50 are respectively replaced by elements 46, 48 and 56, 58. Elements 22–28, 32–38, 42–44 and 52–54 are eliminated.

Current regulating circuit 40 is connected in series with a first floating power supply 66 across an inductive load generally identified by reference numeral 70. Load 70 is shown as having an inductive component 76 and a resistive component 78. The resistive component may, in practice, be the electrical resistance inherent in the material from which the inductor is made. Alternately, a discrete resistor may be connected in series with the inductor in applications in which larger load resistance is desirable for feedback purposes. Regardless of whether the load is considered as having lumped or distributed parameters, it will be characterized by inductance $L$ and resistance $R$ for purposes of describing the present invention.

Current regulating circuit 50 is connected in series with a second floating power supply 68 across load 70. Power supplies 66 and 68 are arranged such that the negative terminal of supply 66 and the positive terminal of supply 68 are connected to a junction point 72 which forms a first input terminal of load 70. A second input terminal of the load is formed by junction point 60 which is maintained at the reference potential. Power supplies 66 and 68 in conjunction with current regulating circuits 40 and 50 respectively provide for current flow through the load in opposite directions.

Although high quality, well regulated power supplies may be advantageously used in the present invention, such power supplies are not required to provide acceptable operation. When employed in conjunction with simple voltage limiting means as hereinafter described, power supplies 66 and 68 may be inexpensive supplies with little regulation. The output voltage of such supplies has appre-ciable ripple, particularly when supplying maximum current. Maximum current is demanded from power supplies 66 and 68 respectively when transistors 48 and 58 are fully conductive. Problems caused by ripple are overcome by providing a pair of unidirectional voltage limiting paths between junction point 72 and the inputs of the emitter follower stages in the current regulating circuits.

Each voltage limiting path includes a pair of diodes in which one electrode of one diode is connected to the like electrode of the other diode, and the series combination connected between junction point 72 and an emitter follower input. A first path comprises a Zener diode 80 and a conventional diode 82 connected between junction point 72 and the input of emitter follower stage 46. The cathodes of diodes 80 and 82 are connected, and the anode of diode 80 is connected to junction point 72. Current flow through the path is, thus, provided only when the voltage at junction point 72 becomes sufficiently negative to break down Zener diode 80.

A second path comprises a Zener diode 84 and a conventional diode 86 connected between junction point 72 and the input of emitter follower stage 56. The anodes of diodes 84 and 86 are connected, and the cathode of diode 84 is connected to junction point 72. Current flow through the path is, thus, provided only when the voltage at junction point 72 becomes sufficiently positive to break down Zener diode 84.

A feedback network 90 is connected between junction point 72 and the non-inverting input of amplifier 14. Feedback network 90 comprises a resistor 92 and a capacitor 94 connected in series between junction point 72 and ground or other suitable source of reference potential. The parameter values of resistor 92 and capacitor 94 are chosen so that the voltage produced at junction point 96 between the resistor and the capacitor is a predetermined time varying function of the voltage at junction point 72. More specifically, the parameter values are chosen so that the voltage at point 96 is proportional to the voltage appearing across resistor 78, and hence proportional to the instantaneous current flowing through load 70. Point 96 is connected to the non-inverting input of amplifier 14 through a resistor 98.

Feedback network 90 is shown as further including a resistor 100 and a resistor 102 connected in series between junction point 72 and ground (or other source of reference potential). A resistor 104 is connected from a junction point 106 between resistors 100 and 102 to the non-inverting input of amplifier 14. Resistors 100, 102 and 104 form a T resistor circuit for producing a signal which compensates for any lag in the signal produced at point 72. Resistors 92, 98, 102 and 104 are illustrated as variable resistors. This feature facilitates optimization of the feedback signal, but is not necessary to the applicant's invention.

Amplifier 10 operates generally as follows. Assuming a control signal such that the voltage at input terminal 12 is increasing with respect to the voltage at input terminal 11, amplifier 14 will produce a positive going output signal. This signal will tend to cause transistor 22 to conduct. Transistor 22 is connected in an emitter follower configuration so that the voltage produced at its emitter follows its base signal. The increasing base voltage results in an increasing emitter voltage which increases the emitter voltage of transistor 42, thus tending to cause transistor 42 to become non-conductive.

This raises the base voltage supplied to transistor 48 through emitter follower stage 46, thus tending to cause transistor 48 to conduct and lower the impedance of the current path from power supply 66 through inductive load 70. Because of the inductance of load 70, the current therethrough cannot increase instantaneously. Initially substantially the entire voltage produced by power supply 66 appears across load 70. Accordingly, a low voltage continues to be supplied to the base of transistor 42 which is maintained in a non-conductive state.

As the current through load 70 increases, an increasing portion of the voltage produced by power supply 66 appears across resistor 62, thus raising the voltage at the base of transistor 42. Transistor 42 becomes increasingly conductive, thus lowering the voltage at the base of transistor 48. The conductivity of transistor 48 is, accordingly decreased to the extent necessary to regulate the current through power supply 66 and load 70 at the magnitude commanded by the signal at the output of amplifier 14.

Concurrently with the previously described operation of the circuitry including transistor 22 and current regulating circuit 40, the positive going signal from amplifier 14 decreases conduction through transistor 32. This raises the voltage at the emitter of transistor 52 and increases conduction therethrough, thereby raising the voltage at the input to emitter follower stage 56 and the base of transistor 58. The increased base voltage decreases conduction through transistor 58, and accordingly increases the impedance of the current path from power supply 68 through load 70. The voltage across resistor 64 decreases to correspond with the decreased current supplied by power supply 68. This results in a voltage at the base of transistor 52 which increases to the extent necessary to maintain the input signal to emitter follower stage 56 at the level which corresponds to the base signal of transistor 32.

The current through load 70 can be visualized as comprising two oppositely directed current components, each of which is supplied by a different power supply. The magnitude of the load current is the magnitude of the difference between the current components. The direction of the load current is determined by the relative magnitudes of the current components. Accordingly, the upper and lower portions of amplifier 10, as shown in FIG. 1, operate differentially to control the magnitude and direction of the current through load 70. In the operation described in the preceding paragraphs, the load current is changed in one sense in response to a corresponding input signal. By similar analysis it can be determined that an oppositely changing input signal will produce a load current change of the opposite sense.

It may be observed that a result similar to that previously described will also be obtained if resistors 20 and 30 are respectively connected directly to the inputs of emitter follower stages 46 and 56, and elements 22–28, 32–38, 42–44 and 52–54 are eliminated. In such an embodiment, an increasing signal at the output of amplifier 14 is transmitted through resistor 20 and emitter follower stage 46 to the base of transistor 48. Such a signal tends to increase conduction through transistor 48, and hence to increase the current in one direction through load 70. A corresponding signal supplied to the base of transistor 58 tends to decrease conduction therethrough, and hence to decrease current flow in the opposite direction through load 70. Accordingly, an input signal at terminal 11 has a similar effect on the load current in either embodiment of amplifier 10. Satisfactory performance is achieved with the simplified embodiment. However, the embodiment including elements 22–28, 32–38, 42–44 and 52–54 may be employed to provide somewhat more precise load current control.

As previously indicated, certain problems caused by poor power supply regulation may be overcome by means of simple unidirectional voltage limiting paths comprising diodes 80, 82 and 84, 86. These voltage limiting paths limit the voltage excursions at junction point 72 to approximately the breakdown voltage of the Zener diodes 80 and 84. Thus, if the voltage at junction point 72 becomes excessively negative, as may occur with a large positive input signal to emitter follower stage 46, Zener diode 80 will break down and lower the input voltage to the emitter follower stage, thus increasing the voltage at junction point 72 (or decreasing the voltage excursion at that point). Zener diode 84 performs a similar function in the event that the voltage at junction point 72 becomes excessively positive. The effect of these unidirectional voltage limiting paths is to avoid saturation of current regulating transistors 48, 58 which would apply the full unregulated power supply voltage, including ripple, across load 70. The unidirectional voltage limiting paths are not required where well regulated power supplies are used, since such supplies will provide high quality outputs even under conditions of maximum demand.

Attention is now directed to operation of RC feedback network 90 by which the principal objectives of the applicant's invention are achieved. FIG. 2 is a graphic illustration of an output signal and corresponding feedback signal associated with operation of amplifier 10. In FIG. 2, voltage is represented by distance along the ordinate axis in a coordinate system and time is represented by distance along the abscissa axis. The curve identified by reference numeral 108 represents the wave form of a voltage appearing at junction point 72 as the result of a step input signal supplied between input terminals 11 and 12. The curve identified by reference numeral 110 is representative of a feedback signal indicative of the current through load 70 produced by the voltage at junction point 72. FIG. 3, which illustrates these signals as they would appear with the feedback circuit disconnected from the amplifier input, emphasizes the operational effect of the feedback circuit.

More specifically, if a negative step signal is applied to terminal 12, a large positive step voltage is produced at junction point 72. This voltage tends to cause current to flow through inductive component 76 and resistive component 78. The current through these elements does not immediately assume its steady state value because of the counter EMF produced by inductive component 76. However, the load current continues to increase until the feedback voltage, which represents load current, reaches the level required to balance the input voltage.

In prior art circuits, resistive component 78 frequently comprises a discrete current sensing resistor. The feedback signal is taken from the junction between the resistor and inductive component 76. The instantaneous feedback voltage is given by the following equation:

$$E_{fb} = i_1 R = E_o(1 - \epsilon^{-(R/L)t})$$

where:

$i_1$ is load current, $E_o$ is voltage at junction point 72, $R$ is load resistance, $L$ is load inductance, and $t$ is time in seconds after a step change in $E_o$.

An effect which does not appear in curve 110 or in the above equation is that high frequency transient pulses are often produced as the result of distributed capacitance in the inductive load. These pulses are reflected in the feedback voltage across the current sensing resistor, and impair operation of the amplifier. Accordingly, the usable feedback signal at the junction of resistive component 78 and inductive component 76 is frequently limited, and may not be sufficient to permit desired operation of amplifier 10.

The present invention avoids the previously described problem by employing an RC feedback network which generates a signal accurately representative of the load current without relying on the current actually flowing through the load. The feedback network comprises resistor 92 having resistance $R'$ and capacitor 94 having capacitance $C$ connected in series across load 70. The instantaneous voltage produced at junction point 96 between resistor 92 and capacitor 94 is given by the following equation:

$$E_{fb} = e_C = E_o\,(1 - \epsilon^{-(t/R'C)})$$

From the equations previously set forth, it can be noted that both feedback schemes will produce equal instantaneous feedback voltages if the values $L$, $R$, $C$ and $R'$ are related in accordance with the equation $L/R = R'C$. Accordingly, a satisfactory feedback signal can be produced in an amplifier employing the present invention by properly choosing the values of resistor 92 and capacitor 94 in feedback network 90.

The fact that the applicant's amplifier can function normally without depending on actual load current permits this amplifier to be used without any load, or with any of several unusual load configurations such as CRT displays employing time sharing yokes. Amplifiers having conventional feedback circuits cannot tolerate interruption of load current without generating extreme transients.

The provision of feedback network 90 eliminates the necessity for a separate current sensing resistor such as resistive component 78. However, if the resistance of inductive component 76 is small, it may be desirable to have a discrete resistor in series therewith to aid in generating a sufficiently large feedback voltage.

Amplifier 10 will operate satisfactorily without the additional feedback supplied by T connected resistors 100, 102 and 104. However, this additional circuitry operating in parallel with RC components 92 and 94 aids in controlling overshoot of the feedback signals produced in response to step inputs. More specifically, it provides a leading feedback signal which can be adjusted to compensate for delay or lag produced by the amplifier circuitry.

Since there may be practical difficulties in calculating the proper parameter values of elements in feedback network 90, the task of optimizing operation of amplifier 10 may be simplified by utilizing variable impedances. One satisfactory method of adjusting these impedances involves application of a sawtooth waveform signal to input terminal 12. Resistor 92 is then adjusted to linearize the various segments of the voltage waveform at junction point 96. Resistor 102 is subsequently adjusted to minimize overshoot of the falling portion of this voltage waveform. Finally, resistors 98 and 104 are adjusted to obtain the desired gain of amplifier 10. In accordance with known analytical techniques, the gain of the amplifier is the ratio of the input resistance to the total resistance in the feedback network.

The various feedback resistors may also be adjusted by utilizing the square wave input. Resistor 92 is then adjusted to linearize the top of the square wave at junction point 96 and resistor 102 is adjusted to minimize overshoot on the rising and falling portions of the square wave.

In summary, the present invention is directed toward an amplifier circuit for use with inductive loads wherein the load may have distributed capacitance. By utilizing an RC feedback network to produce a voltage which accurately represents the load current, detrimental effects of the distributed capacitance can be minimized. A specific embodiment of the applicant's invention has been illustrated and described in detail. Other embodiments of the invention within the applicant's contemplation and teaching will be apparent to those skilled in the art. Accordingly, the applicant does not intend to be limited to the disclosed embodiment, but only by the terms of the appended claims.

What is claimed is:

1. Amplifier apparatus for use with an inductive load characterized by inductance $L$ and resistance $R$ and having first and second input terminals, said amplifier apparatus comprising:

first and second power supplies;

first and second current regulating circuits, each for regulating current flow between first and second terminals thereof;

a differential control circuit for differentially controlling said first and second current regulating circuits in response to the summation of a control signal and a feedback signal;

a source of reference potential;

first connecting means for connecting the first terminals of said first and second current regulating circuits and the first input terminal of the inductive load to said source of reference potential;

second connecting means for respectively connecting said first and second power supplies between the second terminals of said first and second current regulating circuits and the second input terminal of the inductive load, a positive terminal of said first power supply and a negative terminal of said said second power supply being connected to the load;

a resistor and capacitor feedback network for producing an output voltage which is a predetermined time varying function of an input voltage applied thereto;

third connecting means for connecting said feedback network between said source of reference potential and the second input terminal of the inductive load so that the voltage across the load is applied to said feedback network as the input voltage; and fourth connecting means for connecting said feedback network to said differential control circuit so as to supply the output voltage as the feedback signal.

2. The apparatus of claim 1 wherein:

said feedback network comprises a series combination of a capacitor having capacitance $C$ and a first resistor having resistance $R'$, the capacitor being connected to said source of reference potential and the resistor being connected to the second input terminal of the inductive load;

the values of $L$, $R$, $C$ and $R'$ are related in accordance with the equation $L/R = R'C$; and the feedback signal is derived from a first voltage produced between the resistor and the capacitor in said feedback network.

3. The apparatus of claim 2 wherein:

said feedback network further includes a $T$ resistor circuit connected between said source of reference potential and the second input terminal of the inductive load; and the feedback signal is derived from a combination of the first voltage and a second voltage produced by said T resistor circuit.

4. The apparatus of claim 3 wherein each of said first and second current regulating circuits comprises:

a first transistor having emitter, collector and base electrodes;

fifth connecting means for connecting said first transistor, through its emitter and collector electrodes, between one of said first and second floating power supplies and said source of reference potential; and sixth connecting means, including an emitter-follower stage, for connecting said differential control circuit to the base electrode of said first transistor.

5. The apparatus of claim 4 wherein said sixth connecting means further includes a feedback loop comprising a second transistor having a base electrode connected to the emitter electrode of said first transistor and a collector electrode connected to the input of the emitter-follower stage.

6. The apparatus of claim 3 further including:

first and second unidirectional voltage limiting means; and seventh connecting means for connecting said first and said second unidirectional voltage limiting means between the second input terminal of the inductive load and the first and second current regulating circuits respectively so as to limit voltage excursions at the second input terminal of the inductive load.

7. The apparatus of claim 6 wherein each of said first and second unidirectional voltage limiting means comprises a series combination of a conventional diode and a Zener diode, each diode having one electrode connected to the like electrode of the other diode.

8. In combination with apparatus of the type wherein an inductive load characterized by inductance $L$ and resistance $R$ is energized by voltage source means and current regulating means connected in series across the load and wherein the current regulating means is controlled in response to the summation of a command signal and a negative feedback signal proportional to the current flowing through the load, the improvement which comprises:

a capacitor having capacitance C and a first resistor having resistance $R'$, the values $L$, $R$, $C$ and $R'$ being related by the equation $L/R = R'C$;

first connecting means for connecting said capacitor and resistor in series across said load whereby the voltage across said capacitor is continuously proportional to the instantaneous current flowing through said load; and second connecting means for connecting said feedback network to said current regulating means so as to supply the voltage across said capacitor to said current regulating means as the feedback signal.

9. The apparatus of claim 8 wherein:

a series combination of second and third resistors is connected across said load; and the feedback signal is a combination of the voltage across said capacitor and the voltage between the second and third resistors.

10. The apparatus of claim 9 wherein junctions between the first resistor and the capacitor, and between the second and third resistors are respectively connected to said current regulating means through fourth and fifth resistors.

* * * * *